United States Patent
Nomura

(10) Patent No.: US 7,750,959 B2
(45) Date of Patent: Jul. 6, 2010

(54) METHOD AND APPARATUS FOR MANUFACTURING COLOR IMAGE PICKUP DEVICE INCLUDING A RANDOM ARRAY PATTERN AND A REGULAR ARRAY PATTERN

(75) Inventor: Yoshikuni Nomura, Tokyo (JP)

(73) Assignee: Sony Corporation, Tokyo (JP)

( * ) Notice: Subject to any disclaimer, the term of this patent is extended or adjusted under 35 U.S.C. 154(b) by 508 days.

(21) Appl. No.: 11/713,640

(22) Filed: Mar. 5, 2007

(65) Prior Publication Data

US 2007/0296841 A1 Dec. 27, 2007

(30) Foreign Application Priority Data

Mar. 14, 2006 (JP) .............................. 2006-069540

(51) Int. Cl.
  *H04N 3/14* (2006.01)
  *H04N 5/335* (2006.01)
(52) U.S. Cl. ...................................... 348/294; 348/273
(58) Field of Classification Search .......... 348/273–280
  See application file for complete search history.

(56) References Cited

U.S. PATENT DOCUMENTS 5,889,554 A * 3/1999 Mutze ........................ 348/273
6,803,955 B1 * 10/2004 Yosida ........................ 348/272
7,123,299 B1 * 10/2006 Yoshida et al. .............. 348/277
2008/0130991 A1 * 6/2008 O'Brien et al. ............. 382/167

FOREIGN PATENT DOCUMENTS

EP          0 804 037 A2    10/1997
JP          2000-316169     11/2000

* cited by examiner

*Primary Examiner*—Gevell Selby
(74) *Attorney, Agent, or Firm*—Finnegan, Henderson, Farabow, Garrett & Dunner, L.L.P.

(57) ABSTRACT

A method for manufacturing a color image pickup device including a pixel group in which a plurality of pixels each having a photoelectric conversion element and a color filter are arranged includes the steps of generating a random array pattern in which color filters of at least one color component are randomly arranged for an arbitrary pixel position, so that the occurrence frequency of color filters of a color component in a region having a predetermined size including the arbitrary pixel position is within a desired error range, generating a regular array pattern in which color filters of at least one color component are regularly arranged, and generating a color filter pattern by compositing in a regular manner the random array pattern generated in the random array generating step and the regular array pattern generated in the regular array generating step.

6 Claims, 15 Drawing Sheets

| R  | G' | R' | G' | R  | G' | R  | G' |
| G  | B  | G  | B' | G  | B  | G  | B' |
| R' | G' | R  | G' | R' | G' | R  | G' |
| G  | B' | G  | B  | G  | B' | G  | B  |
| R' | G' | R  | G' | R' | G' | R' | G' |
| G  | B' | G  | B  | G  | B' | G  | B  |
| R  | G' | R' | G' | R  | G' | R' | G' |
| G  | B' | G  | B  | G  | B  | G  | B' |

| R  | R' | R  | R  |
|----|----|----|----|
| R' | R  | R' | R  |
| R' | R  | R' | R' |
| R  | R' | R  | R' |

| B  | B' | B  | B' |
|----|----|----|----|
| B' | B  | B' | B  |
| B' | B  | B' | B  |
| B' | B  | B  | B' |

| G | G' | G | G' | G | G' | G | G' |
|---|----|---|----|---|----|---|----|
| G | G' | G | G' | G | G' | G | G' |
| G | G' | G | G' | G | G' | G | G' |
| G | G' | G | G' | G | G' | G | G' |

| R | R' | R | R' |
|---|----|---|----|
| R' | R | R' | R |
| R | R' | R | R' |
| R' | R | R' | R |

FIG. 13

| 0.0000 | 0.0000  | 0.0059  | 0.0000  | 0.0000 |
|--------|---------|---------|---------|--------|
| 0.0000 | -0.0366 | -0.1048 | -0.0366 | 0.0000 |
| 0.0059 | -0.1048 | 0.6400  | -0.1048 | 0.0059 |
| 0.0000 | -0.0366 | -0.1048 | -0.0366 | 0.0000 |
| 0.0000 | 0.0000  | 0.0059  | 0.0000  | 0.0000 |

| R | G | B | G | R | G | R | G |
| G | R | G | R | G | B | G | B |
| B | G | B | G | B | G | R | G |
| G | R | G | B | G | B | G | R |
| B | G | R | G | R | G | B | G |
| G | B | G | B | G | R | G | B |
| R | G | R | G | B | G | B | G |
| G | B | G | R | G | B | G | R |

| R | R | B | R | R | B | R | B |
|---|---|---|---|---|---|---|---|
| B | R | B | B | B | B | R | R |
| B | B | R | B | R | R | B | B |
| R | B | R | R | B | B | B | R |

| G | G | G | G | G | G | G | G |
|---|---|---|---|---|---|---|---|
| G | G | G | G | G | G | G | G |
| G | G | G | G | G | G | G | G |
| G | G | G | G | G | G | G | G |

METHOD AND APPARATUS FOR MANUFACTURING COLOR IMAGE PICKUP DEVICE INCLUDING A RANDOM ARRAY PATTERN AND A REGULAR ARRAY PATTERN

CROSS REFERENCES TO RELATED APPLICATIONS

The present invention contains subject matter related to Japanese Patent Application JP 2006-069540 filed in the Japanese Patent Office on Mar. 14, 2006, the entire contents of which are incorporated herein by reference.

BACKGROUND OF THE INVENTION

1. Field of the Invention

The present invention relates to methods of manufacturing solid-state image pickup devices and color image pickup devices using solid-state image pickup devices used for image pickup apparatuses such as digital cameras and to apparatuses for manufacturing the solid-state image pickup devices and the color image pickup devices.

2. Description of the Related Art

When images are captured using photographing apparatuses which include single-plate solid-state image pickup devices, only a single spectral sensitivity can be obtained. Thus, color photographing techniques, in which filters of different colors are provided for individual pixels and arranged in a predetermined pattern, are widely used. An image captured using such a technique exhibits a color mosaic pattern since each pixel represents only a single color in the image. However, an image having a region with a uniform color from predetermined neighboring pixels can be generated by interpolating color information on the neighbor pixels. This interpolation process is called a color separation process.

However, in this color separation process, individual colors are discretely sampled. Thus, when a photographed image contains a high-frequency component that exceeds a Nyquist frequency, aliasing (folding of high-frequency components onto low-frequency components) occurs, which decreases the color determination accuracy.

To address this problem, techniques have been developed for suppressing the generation of a false color in an image by reducing regularity (periodicity) in an array of color filters. For example, in the pseudo-random Bayer pattern, which has been developed by FillFactory (now Cypress Semiconductor Corporation), a three-color G-checkered pseudo-random array is provided in which green (G) filters are arranged in a checkered pattern, and red (R) filters and blue (B) filters are pseudo-randomly arranged in the remaining blocks (checks) of the checkered pattern.

In addition, Japanese Unexamined Patent Application Publication No. 2000-316169 by Yoshida Hideaki, entitled "Color Image Pickup Element and Device" discloses a six-color random array. In this array, pixels are arranged under the condition that a target pixel is adjacent to pixels (filters) of six colors including the color of the target pixel, at the four sides or the four corners of the target pixel.

Further, in European Patent Application Publication No. 0,804,037(A2) by Dr. Mutze Ulrich, entitled "Process and System for Generating a Full Color Image or Multispectral Image from the Image Data of a CCD Image Sensor with a Mosaic Color Filter", a 3×3 periodic filter array composed of filters of five color components and a pseudo-random array are described.

In the pseudo-random Bayer array of FillFactory (Cypress Semiconductor Corporation), R filters and B filters are arranged in a pseudo-random pattern. However, the repetition rate of the R-B pseudo-random pattern is high. Thus, this pseudo-random Bayer array can cause some change relative to the Bayer array in a position at which a false color is generated in the spatial frequency domain, and thus have little substantial effect on reducing the occurrence of a false colors in an image. On the other hand, the random arrays disclosed by Yoshida and Mutze have more randomness than the pseudo-random Bayer array of FillFactory, and thus an effect on the reduction of the occurrence of false colors can be expected. However, the random arrangements of filters of all color components in these random arrays lead to deterioration of resolution, compared with a Bayer array disclosed in Japanese Patent No. 2931520, in which correlation processing can be executed, and the pseudo-random Bayer described above.

In order to suppress the generation of false colors, color filters of at least one predetermined color component need to be randomly arranged. In order to increase the reproducibility of resolution, color filters of at least one predetermined color component need to be regularly (periodically) arranged.

In addition, in order to interpolate a color component that is not included in a target pixel from neighboring pixels, it is necessary that all colors are arranged in the neighborhood of the target pixel, even if filters of a predetermined color component are randomly arranged.

Such a color filter array that fulfills the necessities described above has yet to be existed.

SUMMARY OF THE INVENTION

The above known techniques for randomly arranging color filters (filters) used in a single-plate color image pickup device have been developed. However, although these techniques are effective in reducing the occurrence of a false color in an image, the reduction is achieved at the expense of the enhancement of color resolution.

The present invention has been made in view of this circumstance. Accordingly, there is a need for a method and an apparatus for manufacturing a color image pickup device which suppresses generation of a false color in an image and increases color resolution.

To this end, according to an aspect of the present invention, a method for manufacturing a color image pickup device including a pixel group in which a plurality of pixels each having a photoelectric conversion element and a color filter are arranged includes the steps of generating a random array pattern in which color filters of at least one color component are randomly arranged for an arbitrary pixel position, so that the occurrence frequency of color filters of a color component in a region having a predetermined size including the arbitrary pixel position is within a desired error range, generating a regular array pattern in which color filters of at least one color component, which is different from the color component of the filters randomly arranged in the random array generating step, are regularly arranged, and generating a color filter pattern by compositing in a regular manner the random array pattern generated in the random array generating step and the regular array pattern generated in the regular array generating step.

According to an aspect of the present invention, an apparatus for manufacturing a color image pickup device including a pixel group in which a plurality of pixels each having a photoelectric conversion element and a color filter are arranged includes random array generating means configured to generate a random array pattern in which color filters of at least one color component are randomly arranged for an arbitrary pixel position, so that the occurrence frequency of color filters of a color component in a region having a predetermined size including the arbitrary pixel position is within a desired error range, regular array generating means configured to generate a regular array pattern in which color filters of at least one color component, which is different from the color component of the filters randomly arranged by the random array generating means, are regularly arranged, and color filter generating means configured to generate a color filter pattern by compositing in a regular manner the random array pattern generated by the random array generating means and the regular array pattern generated by the regular array generating means.

The term "random" as used herein is not intended to mean completely random.

If a color filter array having a completely random arrangement of color components is generated, the occurrence frequency of a color component in a local region may not be stable.

In this specification, a color filter array, in which the occurrence frequency of filters of a color component in a region of a predetermined size which includes a position of a target pixel is within a predetermined error range and regularity (periodicity) in color filter arrangement is sufficiently reduced, is called a random array. In addition, a color filter array, in which filters of each color component are regularly (periodically) arranged, is called a regular array.

Further, in this specification, a color filter array formed by compositing a random array and a regular array is called a partially random array.

In addition, a region having a predetermined size is called a local region.

As a local region, a single rectangular region as well as a plurality of rectangular regions or non-rectangular regions can be used.

When a plurality of regions are used as local regions, an allowable error range of the occurrence frequency of filters of a color component can be set for each of the regions.

In a partially random array according to an embodiment of the present invention, the occurrence frequency of filters of a color component in a local region including a position of a target pixel is also within a desired error range.

However, a local region in a partially random array is regarded as being different from a local region in a random array, and an expected occurrence frequency of filters of a color component in the partially random array is regarded as being different from an expected occurrence frequency of filters of a desired color component in the random array.

A partially random array is formed by compositing a random array and a regular array according to a rule.

Therefore, when a local region and an expected occurrence frequency of a color component in the local region are determined for a partially random array, a local region and an expected occurrence frequency of a color component in the local region can be determined for a random array by considering a procedure of compositing these arrays.

Specifically, by determining the size of a local region and the occurrence frequency of a color component which are sufficient for executing color separation processing on a partially random array, conditions to be imposed on the random array can be determined.

Such a partially random array advantageously reduces the occurrence of a false color in an image due to the random arrangement of a color component in the array, and also advantageously increases the reproducibility of resolution due to the regular arrangement of a color component in the array.

According to an embodiment of the present invention, in a method for generating a color filter array in which filters of color components are randomly arranged, it is preferred that a target pixel position is randomly selected in a color filter array, in which filters of color components are regularly arranged so that the occurrence frequency of filers of a predetermined color component in a predetermined region of a predetermined size including the target pixel position is within a desired error range. Then, a color component C1 (filter color) of the target pixel position is replaced by another color component C2, and the occurrence frequency of the predetermined color component existing in the region of the predetermined size including the target pixel position is examined. When the occurrence frequency is not within the desired error range, the color component (filter color) of the target pixel is reset to the color C1. This procedure is repeated.

With this method of generating a random color filter array, a random color filter array, in which color filters are arranged so that the occurrence frequency of a color component in a region of a predetermined size including a target pixel position is within a desired error range, can be generated.

According to an embodiment of the present invention, in a method of generating a color filter array in which color filters are randomly arranged, it is preferred that the pixel values of an image, which is obtained by high-pass filtering a white noise image having pixel values of continuous values or discrete values represented by predetermined quantization bit numbers using a high-pass filter capable of sufficiently suppressing low frequency components, are quantized. Then, each of the quantized pixel values is associated with one color component.

With this method of generating a random color filter array, a random color filter array, in which color filters are arranged so that the occurrence frequency of a color component in a region of a predetermined size including a target pixel position is within a desired error range, can be generated.

According to an embodiment of the present invention, a method and an apparatus for manufacturing a color image pickup device which permits high resolution imaging as well as the reduction of the occurrence of a false color can be realized.

BRIEF DESCRIPTION OF THE DRAWINGS

FIG. 3 illustrates an RR' random array pattern to be generated by an RR' random array generating unit according to an embodiment of the present invention;

FIG. 4 illustrates a BB' random array pattern to be generated by a BB' random array generating unit according to an embodiment of the present invention;

FIG. 5 illustrates a GG' regular array pattern to be generated by a GG' regular array generating unit according to an embodiment of the present invention;

FIG. 6 illustrates a regular array pattern;

FIG. 13 illustrates examples coefficients of a convolution filter when m=2;

FIG. 18 illustrates an RB random array pattern to be generated by a random array generating unit according to an embodiment of the present invention; and FIG. 19 illustrates a G regular array pattern to be generated by a regular array generating unit according to an embodiment of the present invention.

DESCRIPTION OF THE PREFERRED EMBODIMENTS

In the following, a method and an apparatus for manufacturing a color image pickup device according to an embodiment of the present invention will be described with reference to the accompanying drawings.

First Embodiment

Figure 1:
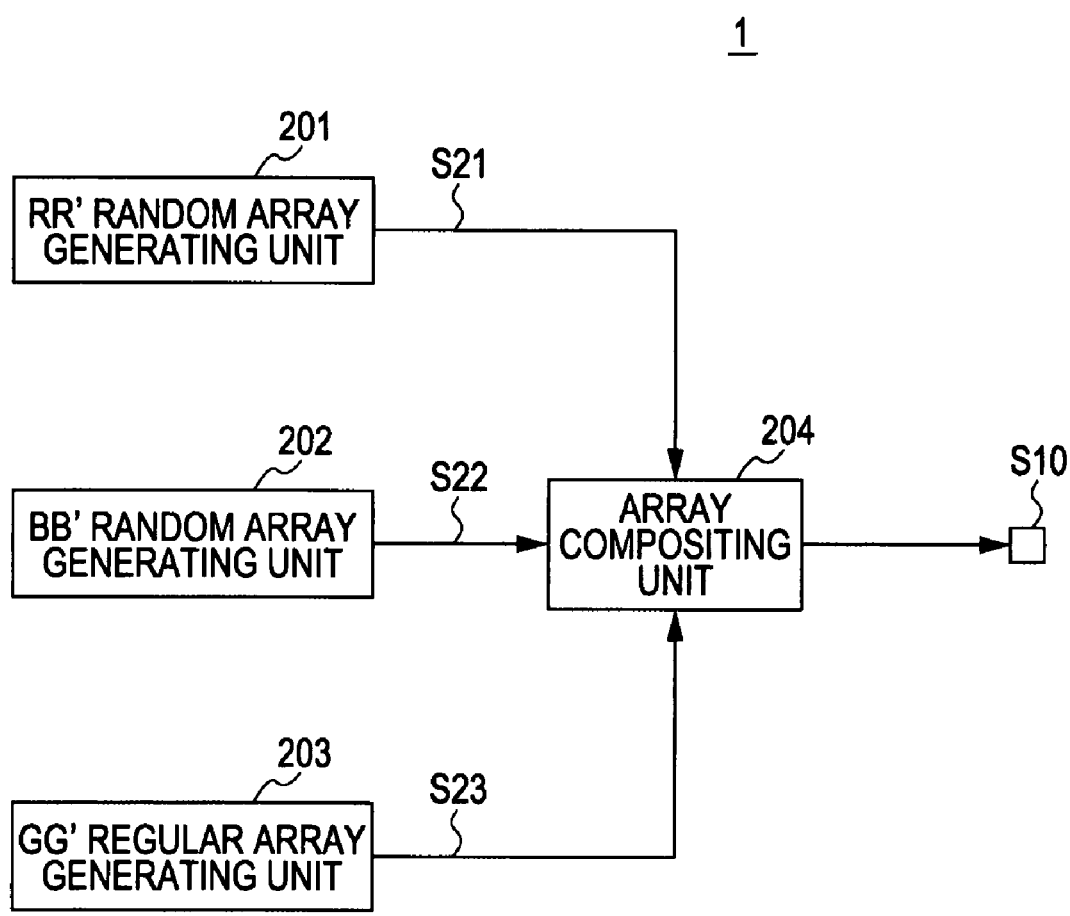
FIG. 1 is a block diagram illustrating a configuration of an image processing apparatus according to an embodiment of the present invention.

FIG. 1 is a block diagram illustrating an image processing apparatus 1 according to the first embodiment of the present invention.

As illustrated in the figure, the image processing apparatus 1 includes an RR' random array generating unit 201, a BB' random array generating unit 202, a GG' regular array generating unit 203, and an array compositing unit 204.

Figure 2:
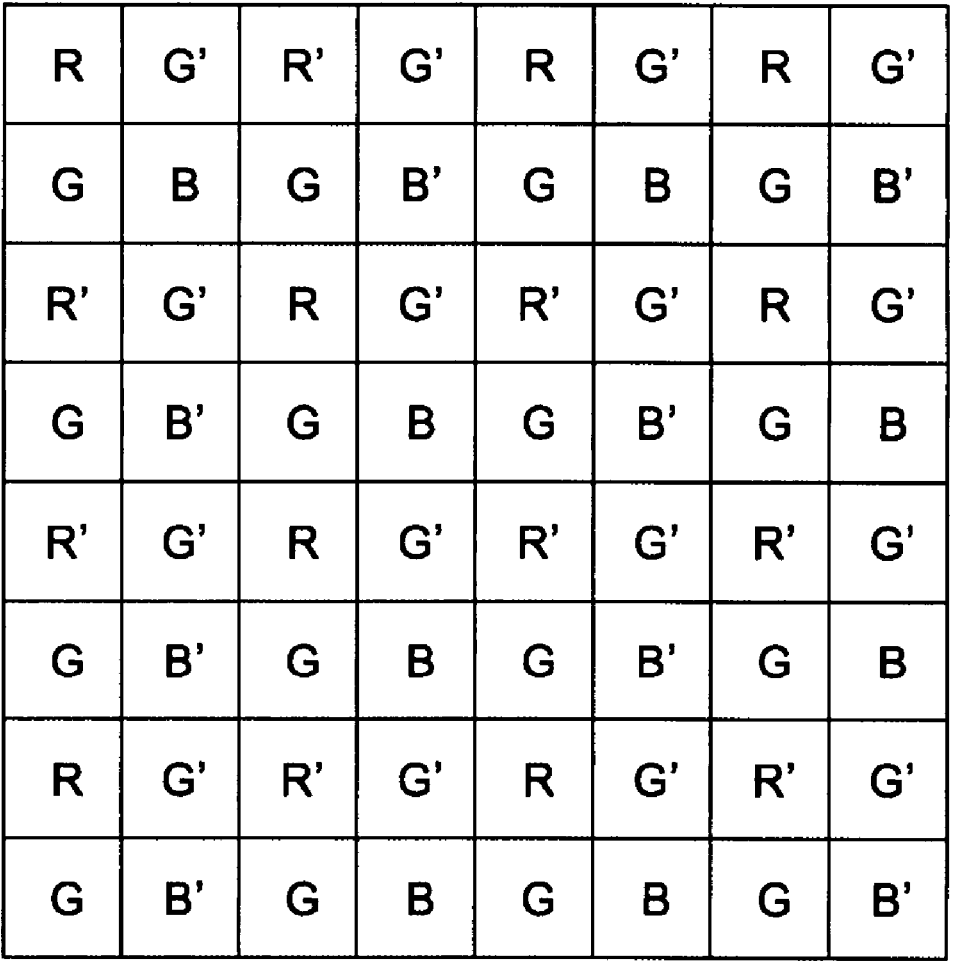
FIG. 2 illustrates a color filter pattern to be generated by an image processing apparatus according to an embodiment of the present invention.

The image processing apparatus 1 generates a color filter pattern S10 as illustrated in FIG. 2.

In the color filter pattern S10, filters of a G component (G filters) are arranged in every other row and column, and filters of a G' color component (G' filters) are arranged in every other row and column, where the G filters are not arranged.

Filters of an R component (R filters) and filters of an R' component (R' filters) are randomly arranged in every other row and column and at positions where the G and G' filters are not arranged.

Filters of a B component (B filters) and filters of a B' component (B' filters) are randomly arranged at the positions where the G and G' filters and the R and R' filters are not arranged.

Note that the positions of the G and G' filters, the R and R' filters, and the B and B' filters represent the positions of pixels (photoelectric conversion devices) of corresponding color components or the positions of color components on a filter pattern.

In addition, each R' filter is associated with a color which is closer to the color of the R filter than the colors of the B and B' filters and the G and G' filters.

Each B' filter is associated with a color which is closer to the color of the B filter than the colors of the R and R' filters and the G and G' filters.

Each G' filter is associated with a color which is closer to the color of the G filter than the colors of the R and R' filters and the B and B' filters.

In this embodiment, each of "R" and "R'" represents a red color component, each of "B" and "B'" represents a blue color component, and each of "G" and "G'" represents a green color component.

In the image processing apparatus 1 illustrated in FIG. 1, the RR' random array generating unit 201 generates an RR' random array pattern S21 in which the R filters and the R' filters are arranged, as illustrated in FIG. 3.

The BB' random array generating unit 202 generates a BB' random array pattern S22 in which the B filters and the B' filters are arranged, as illustrated in FIG. 4.

The GG' regular array generating unit 203 generates a GG' regular array pattern S23 in which only the G filters and the G' filters are arranged, as illustrated in FIG. 5.

The array compositing unit 204 rearranges the RR' random array pattern S21 so that a space of one pixel is provided between the individual pixels (color filters). The array compositing unit 204 also rearranges the BB' random array pattern S22 so that a space of one pixel is provided between the individual pixels (color filters). In addition, the array compositing unit 204 rearranges the GG' regular array pattern S23 so that the GG' regular array pattern S23 is a checkered pattern. Then, the array compositing unit 204 composites these rearranged patterns, such that the color filter pattern S10, which is a partially random array pattern, is generated.

In the following, each of the components constituting the image processing apparatus 1 illustrated in FIG. 1 will be described.

[RR' Random Array Generating Unit 201]

The RR' random array generating unit 201 first generates a regular array pattern S30 of n×n pixels, in which the R filters and the R' filters are regularly arranged, as illustrated in FIG. 6.

Figure 7:
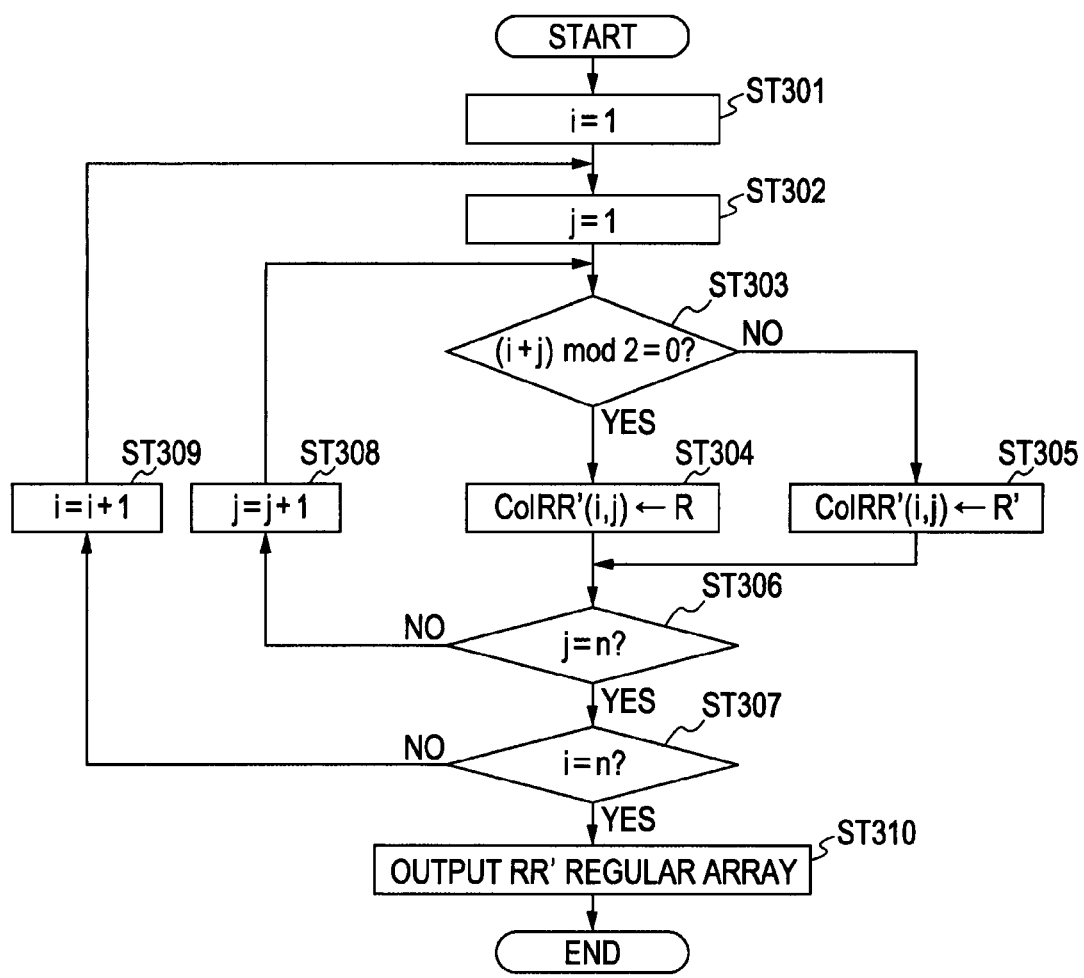
FIG. 7 is a flowchart illustrating a processing procedure performed by an RR' random array generating unit for generating a regular array pattern.

FIG. 7 illustrates a processing procedure performed by the RR' random array generating unit 201 for generating the regular array pattern S30.

At STEP ST301, the RR' random array generating unit 201 initializes a variable i representing a position of each pixel to be processed to 1. At STEP ST302, the RR' random array generating unit 201 initializes a variable j representing a position of each pixel to be processed to 1.

Then, at STEP ST303, the RR' random array generating unit 201 determines whether or not the residue resulting from division of i+j by 2 is 0. If it is determined in STEP ST303 that the residue is 0, then at STEP ST304, the color component of a pixel (filter) at a position (i, j) is set to R. If it is determined in STEP ST303 that the residue is not 0, the color component of a pixel (filter) at a position (i, j) is set to R' at STEP ST305.

ColRR'(i, j) as used in FIG. 7 represents the color component of a pixel (filter) at a position (i, j).

Hereinafter, ColZ(x, y) represents the color component of a pixel at a position (x, y). The index part (Z, in this case) can be any character or character string as necessary to distinguish the arrays.

ColRR'(x, y) represents the color of an array composed of the R filters and the R' filters. ColBB'(x, y) represents the color of an array composed of the B filters and the B' filters. In addition, ColGG'(x, y) represents the color of an array composed of the G filters and the G' filters. Further, Colcomp(x, y) represents the color of a composite array obtained by compositing the above three arrays.

Then, at STEP ST306, the RR' random array generating unit 201 determines whether or not the variable j is equal to n. If it is determined in STEP ST306 that the variable j is not equal to n, the RR' random array generating unit 201 updates the variable j to j+1 at STEP S308, and then the procedure returns to the processing of STEP ST303. If it is determined in STEP ST306 that the variable j is equal to n, the procedure proceeds to STEP ST307.

At STEP S307, the RR' random array generating unit 201 determines whether or not the variable i is equal to n. If it is determined in STEP ST307 that the variable i is not equal to n, the RR' random array generating unit 201 updates the variable i to i+1 at ST309, and then the procedure returns to the processing of STEP ST302. If it is determined in STEP ST307 that the variable i is equal to n, the processing proceeds to STEP ST310. At STEP ST310, the RR' random array generating unit 201 generates the regular array pattern S30 of n×n pixels in which the R filters and the R' filters are regularly arranged.

Figure 8:
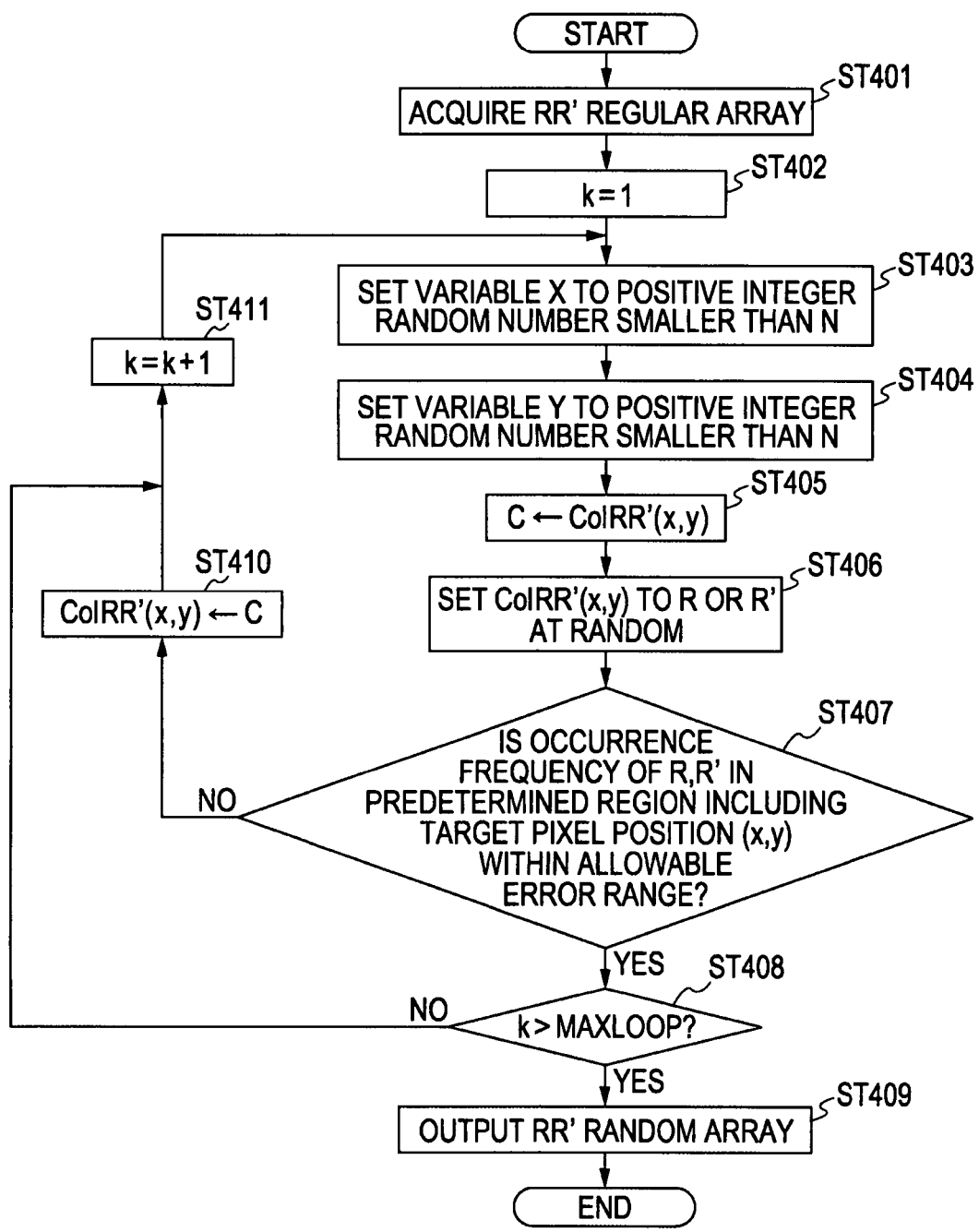
FIG. 8 is a flowchart illustrating a processing procedure performed by an RR' random array generating unit for generating an RR' random array pattern on the basis of a regular array pattern.

FIG. 8 is a flowchart illustrating a processing procedure performed by the RR' random array generating unit 201 for generating the RR' random array pattern S21 on the basis of the regular array pattern S30 generated using the procedure illustrated in FIG. 7.

AT STEP ST401, the RR' random array generating unit 201 acquires the regular array pattern S30 generated using the procedure of FIG. 7.

At STEP ST402, the RR' random array generating unit 201 initializes a variable k representing the number of loops to 1.

AT STEP ST403, the RR' random array generating unit 201 sets the variable x representing a position of a target pixel to a random number, which is a positive integer less than n. At STEP ST404, the RR' random array generating unit 201 sets the variable y representing a position of a target pixel to a random number, which is a positive integer less than n.

There are various schemes for generating such a random number. It is desirable that there is no deviation in the distribution of generated random numbers. For example, the Mersenne Twister method can be used which is disclosed in Matsumoto, M. and Nishimura, T., "Mersenne Twister: A 623-dimensionally equidistributed uniform pseudorandom number generator", ACM Trans. on Modeling and Computer Simulation Vol. 8, No. 1, January pp. 3-30.

At STEP ST405, the RR' random array generating unit 201 temporarily stores ColRR'(x, y) in a variable C.

At STEP ST406, the RR' random array generating unit 201 sets ColRR'(x, y) to R or R' at random. This random selection of R or R' is based on a value of a residue obtained by a division operation using a positive integer which is sufficiently large. Specifically, R is selected when a residue resulting from division of the positive integer by 2 is 0. R' is selected when a residue resulting from the same division operation is 1.

At STEP ST407, the RR' random array generating unit 201 determines whether or not the occurrence frequency of the R filters and the R' filters in a local region including a target pixel position (x, y) is within a desired error range.

If it is determined in STEP ST407 that the occurrence frequency is not within the desired error range, the procedure proceeds to STEP ST410. AT STEP ST410, the RR' random array generating unit 201 resets ColRR'(x, y) to C. The RR' random array generating unit 201 updates the variable k to k+1 at STEP ST411, and then the procedure returns to STEP ST403. On the other hand, if it is determined in STEP ST407 that the occurrence frequency is within the desired error range, the procedure proceeds to STEP ST408.

AT STEP ST408, the RR' random array generating unit 201 determines whether or not the variable k is greater than a constant MAXLOOP representing the maximum number of loops. If it is determined in STEP S408 that the variable k is equal to or less than the constant MAXLOOP, the RR' random array generating unit 201 updates the variable k to k+1 at STEP ST411, and the procedure returns to STEP S403. If it is determined in STEP ST408 that the variable k is greater than the constant MAXLOOP, the RR' random array generating unit 201 outputs the RR' random array pattern S21 of n×n pixels composed of the R filters and the R' filters at STEP ST409, and thus the procedure is terminated.

Figure 9:
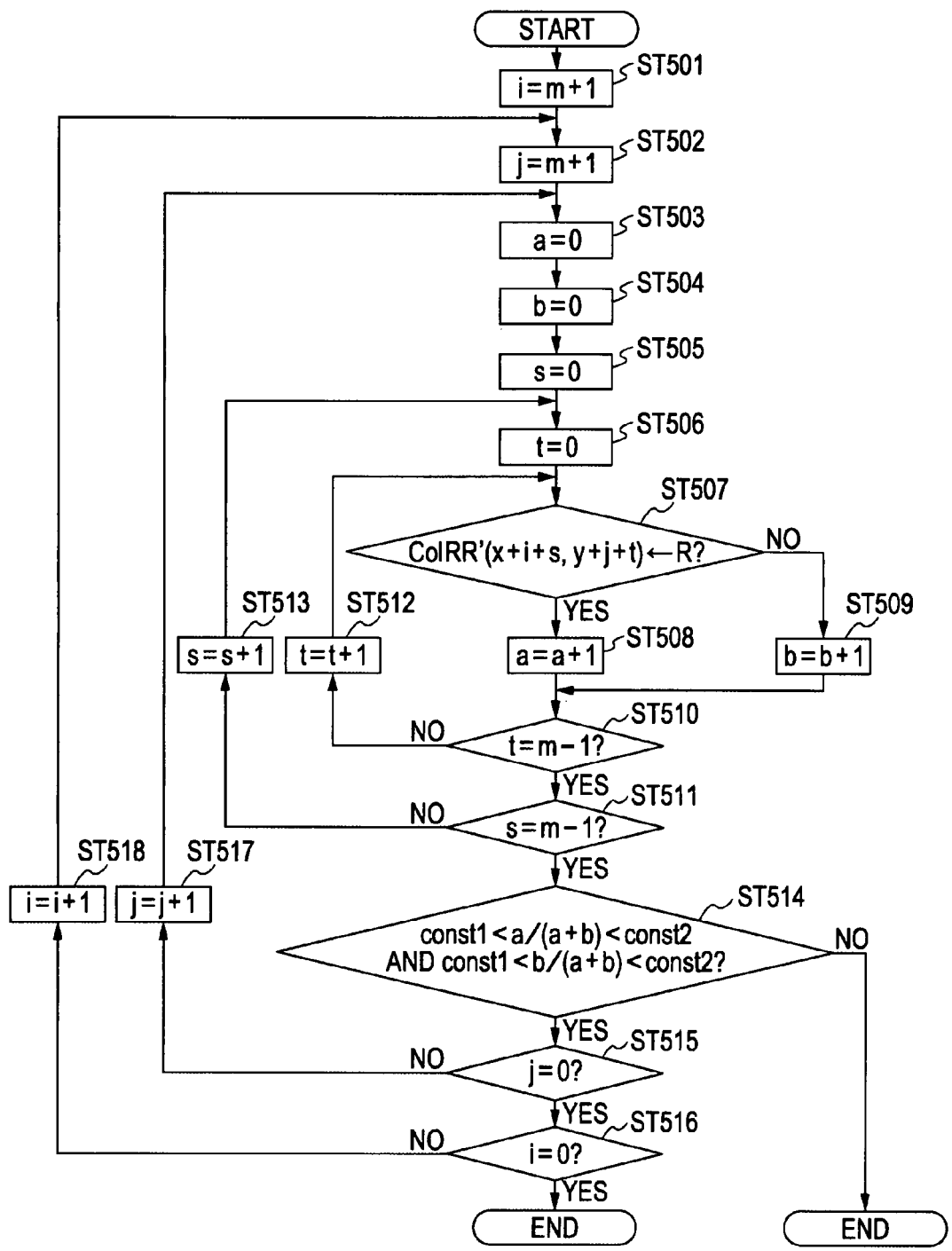
FIG. 9 is a flowchart illustrating processing of STEP ST407 illustrated in FIG. 8 which is performed by an RR' random array generating unit.

FIG. 9 is a flowchart illustrating a procedure of the processing of STEP ST407 in detail, which is performed by the RR' random array generating unit 201 as described with reference to the flowchart in FIG. 8.

In this embodiment, a local area used for examining the occurrence frequency of filters of a predetermined color component is assumed to be a single rectangular region which has a size of m×m pixels and includes a position of a target pixel (x, y). Then, determination is performed as to whether the occurrence frequency of the R filters and the R' filters in the rectangular region is greater than a constant const1 and less than a constant const2.

The RR' random array generating unit 201 initializes a variable i representing a position of a local area to −m+1 at STEP ST501 and initializes a variable j representing a position of a local area to −m+1 at STEP ST502.

At STEP ST503, the RR' random array generating unit 201 initializes a variable a representing the number of the R filters included in the local region to 0. At STEP ST504, the RR' random array generating unit 201 initializes a variable b representing the number of the R' filters included in the local region to 0.

Then, the RR' random array generating unit 201 initializes a variable s representing a position of each pixel to be processed in the local region to 0 at STEP ST505, and initializes a variable t representing a position of each pixel to be processed in the local region to 0 at STEP ST506.

At STEP ST507, the RR' random array generating unit 201 examines whether or not ColRR'(x+i+s, y+j+t) represents R. Note that the variables x and y used in this processing is the same as those used in the procedure of FIG. 8.

If it is determined in STEP ST507 that ColRR'(x+i+s, y+j+t) represents R, the RR' random array generating unit 201 updates the variable a to a+1 at STEP ST508, and the procedure proceeds to STEP ST510.

On the other hand, if it is determined in STEP ST507 that ColRR'(x+i+s, y+j+t) does not represent R, the RR' random array generating unit 201 updates the variable b to b+1, and the procedure proceeds to STEP ST510.

At STEP ST510, the RR' random array generating unit 201 determines whether or not the variable t is equal to m−1. If it is determined that the variable t is not equal to m−1, the RR' random array generating unit 201 updates the variable t to t+1 at STEP ST512, and the procedure returns to STEP ST507. If it is determined in STEP ST510 that the variable t is equal to m−1, the processing proceeds to STEP ST511.

Subsequently, at STEP ST511, the RR' random array generating unit 201 determines whether or not the variable s is equal to m−1. If it is determined that the variable s is not equal to m−1, the RR' random array generating unit 201 updates the variable s to s+1 at STEP ST513, and the procedure returns to STEP S506. If it is determined in STEP ST511 that the variable s is equal to m−1, the procedure proceeds to STEP ST514.

AT STEP ST514, the RR' random array generating unit 201 examines whether or not const1<a/(a+b)<const2 holds and also const1<b/(a+b)<const2 holds. If it is determined in STEP ST514 that this condition is not satisfied, the RR' random array generating unit 201 determines the occurrence frequency of the R filters and the R' filters in the local region including the position of the target pixel (x, y) is not within the desired error range.

On the other hand, it is determined in STEP ST514 that the above condition is satisfied, the procedure proceeds to STEP ST515.

At STEP ST515, the RR' random array generating unit 201 determines whether or not the variable j is equal to 0. If it is determined that the variable j is not equal to 0, the RR' random array generating unit 201 updates the variable j to j+1 at STEP ST517, and the procedure returns to STEP ST503. If it is determined that the variable j is equal to 0, the procedure proceeds to STEP ST516.

At STEP ST516, the RR' random array generating unit 201 determines whether or not the variable i is equal to 0. If it is determined that the variable i is not equal to 0, the RR' random array generating unit 201 updates the variable i to i+1 at STEP ST518, and the procedure returns to STEP ST502. If it is determined in STEP ST516 that the variable i equal to 0, the RR' random array generating unit 201 determines that the occurrence frequency of the R filters and the R' filters in the local region including the position of the target pixel (x, y) is within the desired error range.

[BB' Random Array Generating Unit 202]

The BB' random array generating unit 202 performs processing on the B filters and the B' filters, which is similar to the processing performed by the RR' random array generating unit 201 on the R filters and the R' filters (processing illustrated in FIG. 7 to FIG. 9), and thus the description thereof will be omitted.

[GG' Regular Array Generating Unit 203]

The GG' regular array generating unit 203 generates the color filter pattern S23 illustrated in FIG. 2, which is a regular array pattern of n×2n pixels. In this color filter pattern S23, the G filters and the G' filters are regularly arranged, as described above.

Figure 10:
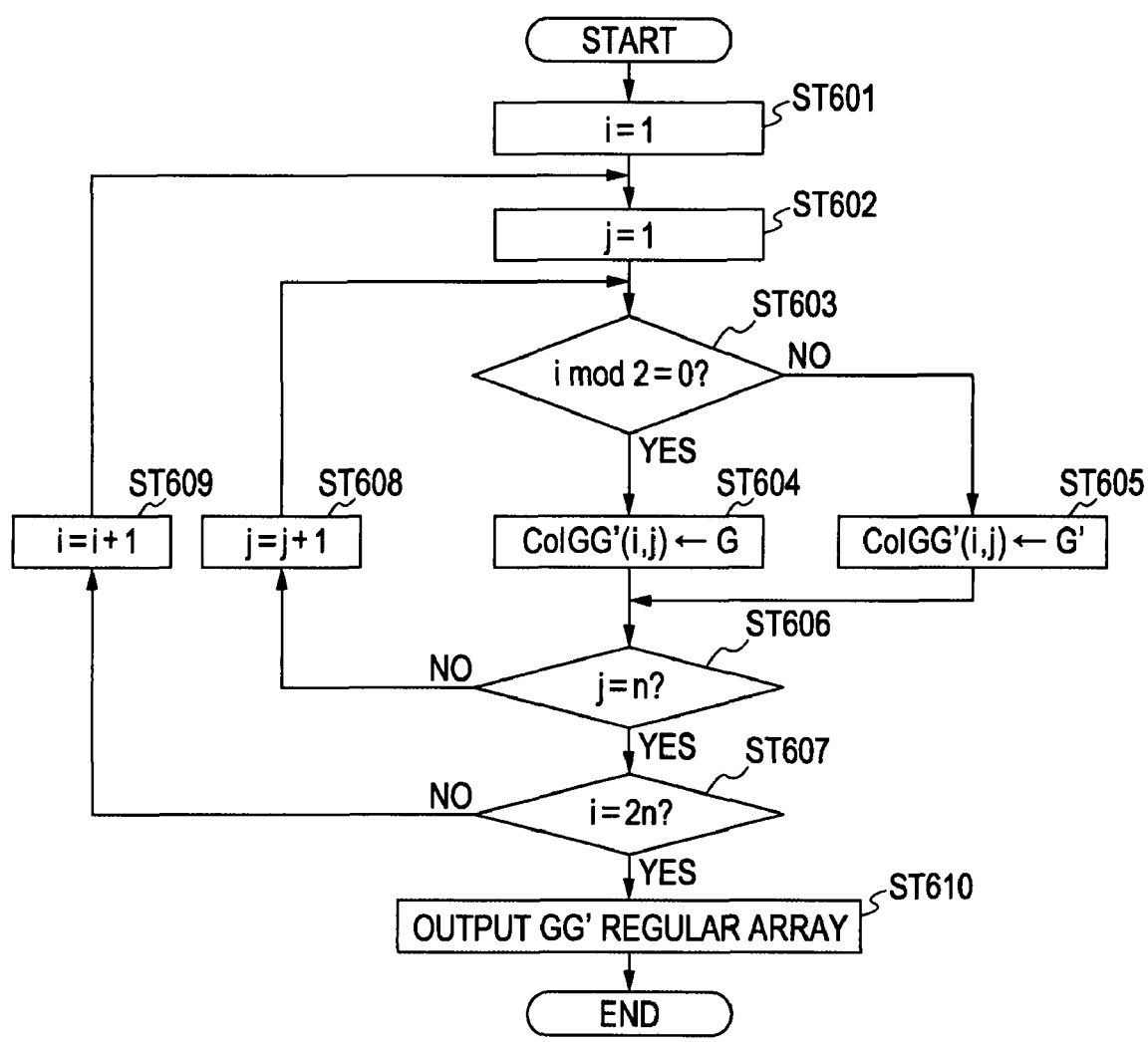
FIG. 10 is a flowchart illustrating a processing procedure performed by a GG' regular array generating unit.

FIG. 10 is a flowchart illustrating a processing procedure performed by the GG' regular array generating unit 203.

At STEP ST601, the GG' regular array generating unit 203 initializes a variable i representing a position of each pixel to be processed to 1. At STEP ST602, the GG' regular array generating unit 203 initializes a variable j representing a position of each pixel to be processed to 1.

At STEP ST603, the GG' regular array generating unit 203 determines whether or not a residue resulting from division of the variable i by 2 is 0. If it is determined in STEP ST603 that the residue is 0, the GG' regular array generating unit 203 sets ColGG'(i, j) to G at STEP ST604. If it is determined in STEP ST603 that the residue is not 0, the GG' regular array generating unit 203 sets ColGG'(i, j) to G' at STEP ST605.

Then, at STEP ST606, the GG' regular array generating unit 203 determines whether or not the variable j is equal to n. If it is determined that j is not equal to n, the GG' regular array generating unit 203 updates the variable j to j+1 at STEP ST608, and then the procedure returns to STEP ST603. If it is determined in STEP ST606 that the variable j is equal to n, the procedure proceeds to STEP ST607.

At STEP ST607, the GG' regular array generating unit 203 determines whether or not the variable i is equal to 2n. If it is determined that the variable i is not equal to 2n, the GG' regular array generating unit 203 updates the variable i to i+1 at STEP ST609, and the procedure returns to STEP ST602. If it is determined in STEP ST607 that the variable i is equal to 2n, the procedure proceeds to STEP ST610. At STEP ST610, the GG' regular array generating unit 203 outputs the GG' regular array pattern S23 of n×2n pixels, and thus the procedure is terminated.

[Array Compositing Unit 204]

The array compositing unit 204 generates the color filter pattern S10 illustrated in FIG. 2, which is a partially random array of 2n×2n pixels having color filters of the six color components R, R', B, B', G, and G'. The array compositing unit 204 generates this color filter pattern S10 on the basis of the RR' random array pattern A21 generated by the RR' random array generating unit 201, the BB' random array pattern S22 generated by the BB' random array generating unit 202, and the GG' regular array pattern S23 generated by the GG' regular array generating unit 203.

Figure 11:
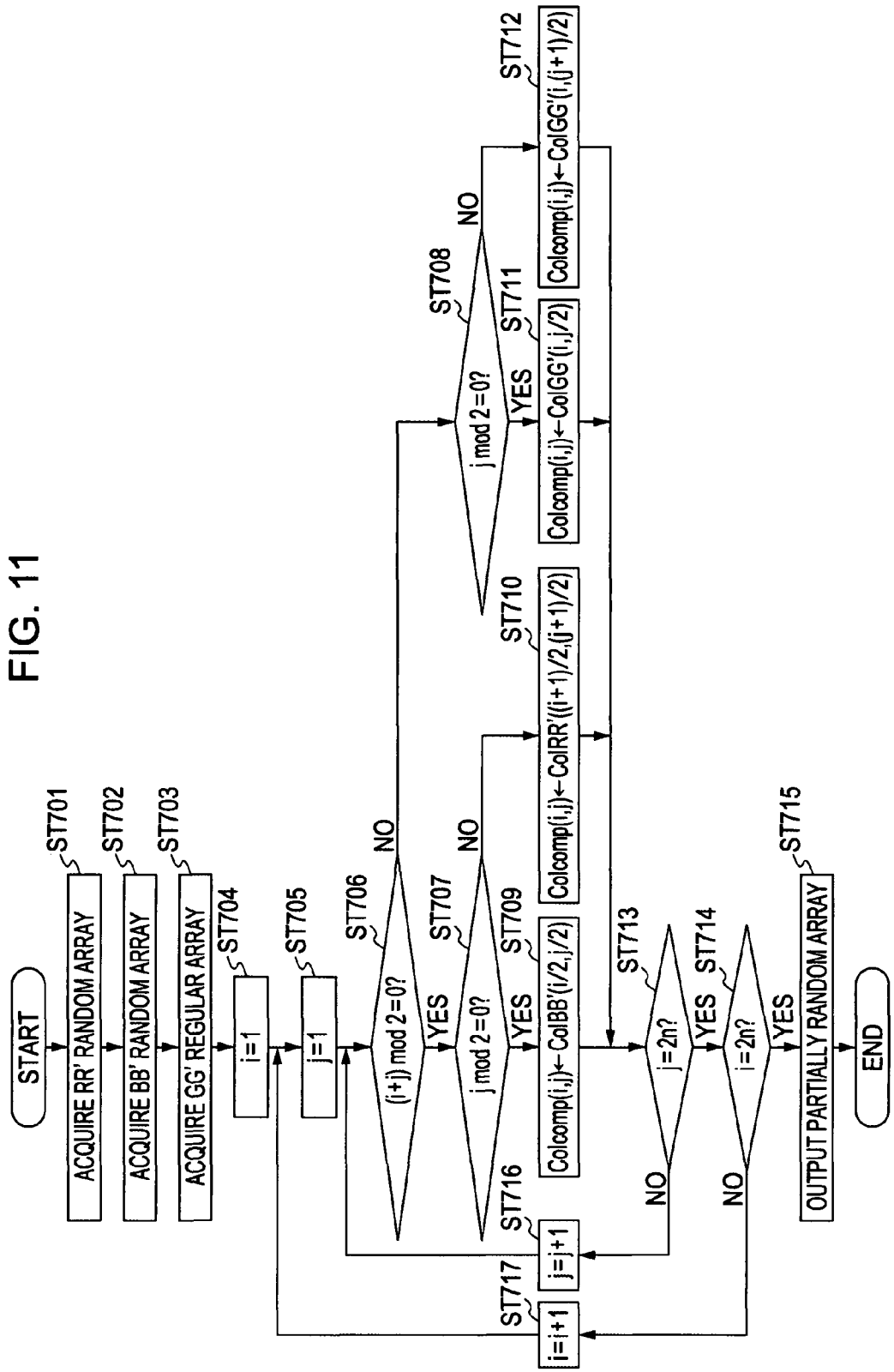
FIG. 11 is a flowchart illustrating a processing procedure performed by an array compositing unit.

FIG. 11 is a flowchart illustrating a processing procedure performed by the array compositing unit 204.

At STEP ST701, the array compositing unit 204 acquires the RR' random array of n×n pixels which is generated by the RR' random array generating unit 201. At STEP ST702, the array compositing unit 204 acquires the BB' random array random array of n×n pixels which is generated by the BB' random array generating unit 202.

At STEP ST703, the array compositing unit 204 acquires the GG' regular array of n×2n pixels which is generated by the GG' regular array generating unit 203.

Then, at STEP ST704, the array compositing unit 204 initializes a variable i representing a position of each pixel to be processed to 1. At STEP ST705, the array compositing unit 204 initializes a variable j representing a position of each pixel to be processed to 1.

At STEP ST706, the array compositing unit 204 determines whether or not a residue resulting from division of i+j by 2 is 0. If it is determined that the residue is 0, the procedure proceeds to ST707. If it is determined that the residue is not 0, the procedure proceeds to STEP ST708.

At STEP ST707, the array compositing unit 204 determines whether or not a residue resulting from division of j by 2 is 0. If it is determined that the residue is 0, the array compositing unit 204 sets Colcomp(i, j) to ColBB'(i/2, j/2) at STEP ST709, and the procedure proceeds to STEP ST713. If it is determined in STEP ST707 that the residue is not 0, the array compositing unit 204 sets Colcomp(i, j) to ColRR'((i+1)/2, (j+1)/2)) at STEP ST710, and the procedure proceeds to STEP ST713.

At STEP ST708, the array compositing unit 204 determines whether or not a residue resulting from division of j by 2 is 0. If it is determined that the residue is 0, the array compositing unit 204 sets Colcomp(i, j) to ColGG'(i, j/2) at STEP ST711, and the procedure proceeds to STEP ST713. If it is determined that the residue is not 0, the array compositing unit 204 sets Colcomp(i, j) to ColGG'(i, (j+1)/2) at STEP ST712, and the procedure proceeds to STEP ST713.

At STEP ST713, the array compositing unit 204 determines whether of not the variable j is equal to 2n. If it is determined that the variable j is not equal to 2n, the array compositing unit 204 updates the variable j to j+1 at STEP ST716, and the procedure returns to STEP ST706. If it is determined in STEP ST713 that the variable j is equal to 2n, the procedure proceeds to STEP ST714.

At STEP ST714, the array compositing unit 204 determines whether or not the variable i is equal to 2n. If it is determined that the variable i is not equal to 2n, the array compositing unit 204 updates the variable i to i+1 at STEP ST717, and the processing returns to STEP ST705. If it is determined in STEP ST714 that the variable i is equal to 2n, the procedure proceeds to STEP ST715. At STEP ST715, the array compositing unit 204 outputs the color filter pattern S10 that is a partially random array of 2n×2n pixels.

As described above, according to the image processing apparatus 1, the color filter pattern S10, in which filters of at least one color component are randomly arranged, can be generated. Such a color filter array can be used in a single-plate color image pickup device.

In an image pickup apparatus having an image pickup device using the color filter pattern S10, filters of a predetermined color component are randomly arranged. This arrangement reduces the occurrence of a false color in an image. In addition, in the color filter pattern S10, filters of a predetermined color component are regularly arranged. This arrangement increases the reproducibility of resolution. In addition, in the image processing apparatus 1, filters are randomly arranged, and at the same time, an array pattern is determined for an arbitrary target pixel position so that the occurrence frequency of filters of a color component in a region of a predetermined size including the target pixel position of is within a desired error range. Thus, there are pixels of all color components (filters) in the neighborhood of the target pixel. Under this condition, a color separation process is performed so that the color filter pattern S10 is generated.

Second Embodiment

In this embodiment, a case is described where a random array is generated from a white noise image, using the RR' random array generating unit 201 and the BB' random array generating unit 202 illustrated in FIG. 1.

In this case, a blue noise image is generated by a blue noise image generating unit by applying a high-pass filter to white noise image data generated by a white noise image generating unit.

The RR' random array generating unit 201 performs binarization processing on the blue noise image using an error diffusion technique. Then, the RR' random array generating unit 201 associates each of the binary values obtained by the binarization processing with either R or R', so as to generate the RR' random array pattern S21 illustrated in FIG. 3.

First, the white noise image generating unit will be described.

The white noise image generating unit generates a white noise image of n×n pixels each having a pixel value which is a real number value within the range [0, 1].

Figure 12:
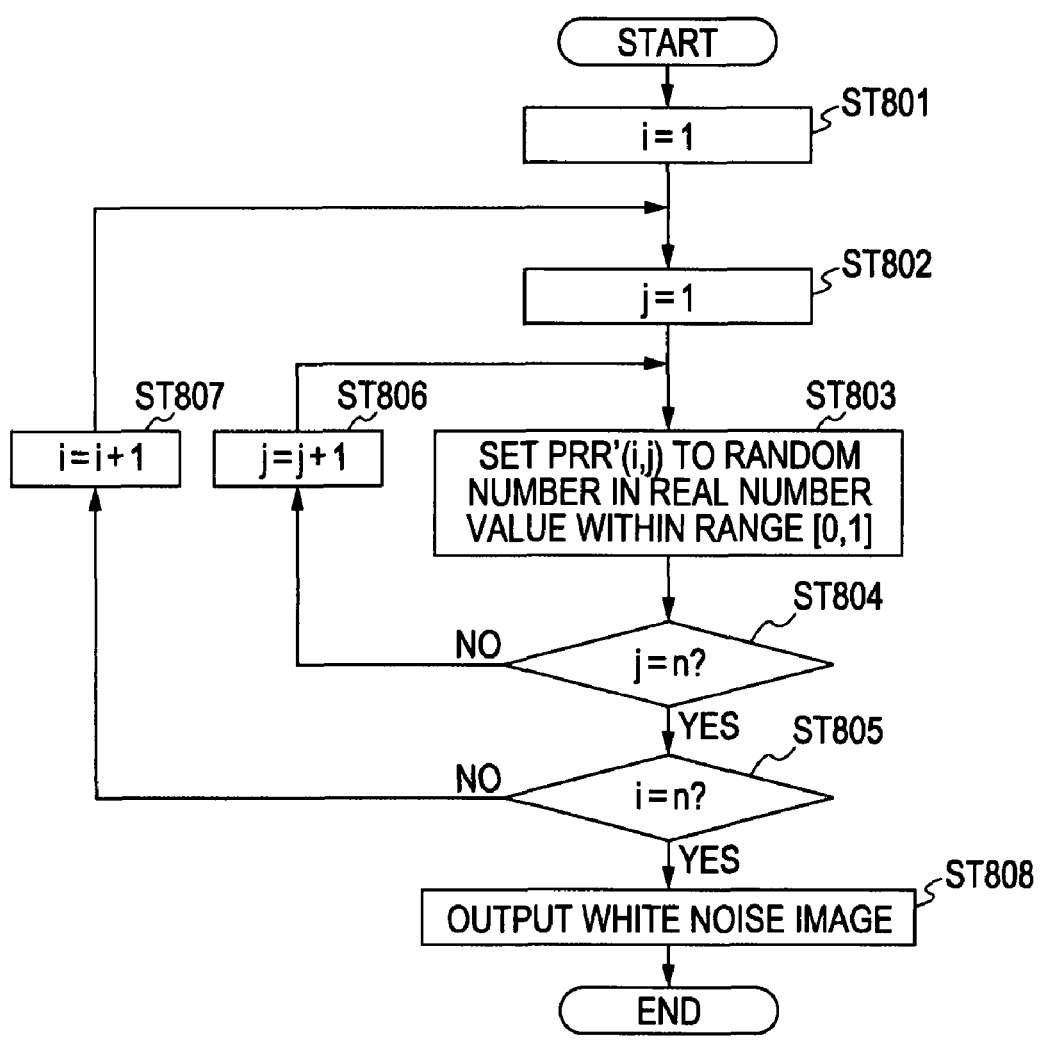
FIG. 12 is a flowchart illustrating a procedure for generating a white noise image according to an embodiment of the present invention.

FIG. 12 is a flowchart illustrating a procedure for generating a white noise image in the present embodiment.

At STEP ST801, the white noise image generating unit initializes a variable i representing a position of each pixel to be processed to 1. At STEP ST802, the white noise image generating unit initializes a variable j representing a position of each pixel to be processed to 1.

At STEP ST803, the white noise image generating unit sets a pixel value at a pixel position (i, j) to a random number which is a real number value within the range [0, 1].

In FIG. 12, PRR'(i, j) represents a pixel value at a pixel position (i, j) in the white noise image.

Subsequently, at STEP ST804, the white noise image generating unit determines whether or not the variable j is equal to n. If it is determined that the variable j is not equal to n, the white noise image generating unit updates the variable j to j+1 at STEP ST806, and the procedure returns to STEP ST803. If it is determined that the variable j is equal to n, the procedure proceeds to STEP ST805.

At STEP ST805, the white noise image generating unit determines whether or not the variable i is equal to n. If it is determined that the variable i is not equal to n, the white noise image generating unit updates the variable i to i+1 at STEP ST807, and the procedure returns to STEP ST802. If it is determined in STEP ST805 that the variable i is equal to n, the white noise image generating unit outputs the white noise image of n×n pixels at STEP ST808, and thus the procedure is terminated.

Next, the blue noise image generating unit will be described.

The blue noise image generating unit uses a high-pass filter for the white noise image, and generates a blue noise image of n×n pixels each having a pixel value of a real number value within the range [0, 1].

In this embodiment, a convolution filter having a size of 2m+1×2m+1 pixels serves as the high-pass filter.

FIG. 13 illustrates examples of coefficients of the convolution filter when m=2.

Alternatively, high-pass filtering in the frequency domain may be performed using the Fourier transform as another embodiment.

Figure 14:
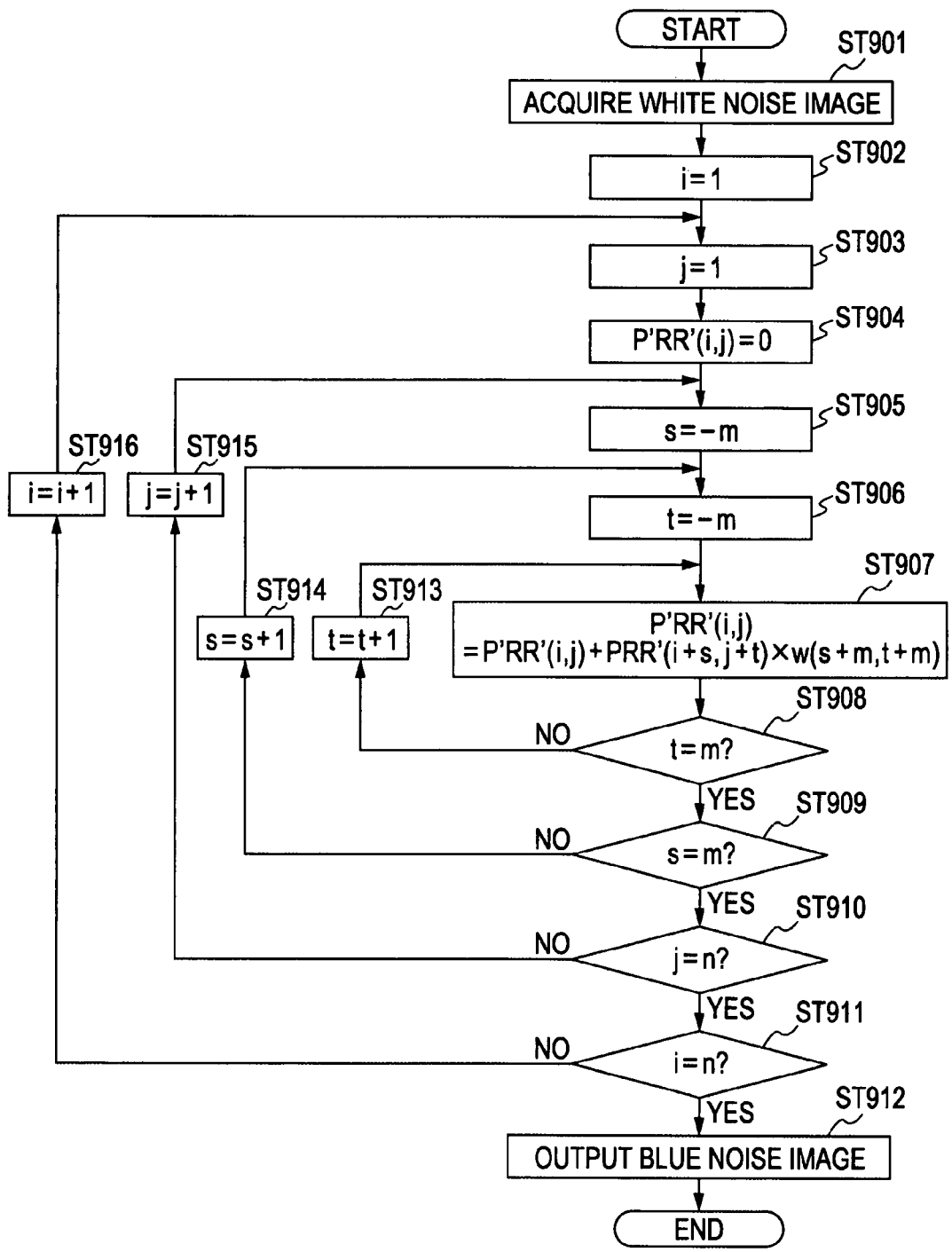
FIG. 14 is a flowchart illustrating a processing procedure performed by a blue noise image generating unit.

FIG. 14 is a flowchart illustrating a processing procedure performed by the blue noise image generating unit.

At STEP ST901, the blue noise image generating unit acquires the white noise image of n×n pixels generated by the white noise image generating unit.

At STEP ST902, the blue noise image generating unit initializes a variable i representing a position of each pixel to be processed to 1. At STEP ST903, the blue noise image generating unit initializes a variable j representing a position of each pixel to be processed to 1.

Then, at STEP ST904, the blue noise image generating unit initializes a pixel value at a pixel position (i j) to 0.

Note that P'RR'(i, j) as shown in FIG. 14 represents a pixel value at a pixel positions (i, j) in the blue noise image.

At STEP ST905, the blue noise image generating unit initializes a variable s representing the position of a pixel in the convolution filter to "−m". At STEP ST906, the blue noise image generating unit initializes a variable t representing a position of a pixel in the convolution filter to −m.

At STEP ST907, the blue noise image generating unit multiplies PRR'(i+s, j+t) by a coefficient of the convolution filter w(s+m, t+m) and adds P'RR'(i, j) to the result of the multiplication. The result is set as an updated P'RR'(i, j).

At STEP ST908, the blue noise image generating unit determines whether or not the variable t is equal to m. If it is determined that the variable t is not equal to m, the blue noise image generating unit updates the variable t to t+1 at STEP ST913, and the procedure returns to STEP S907. If it is determined in STEP ST908 that the variable t is equal to m, the procedure proceeds to STEP ST909.

At STEP ST909, the blue noise image generating unit determines whether or not the variable s is equal to m. If it is determined that the variable s is not equal to m, the blue noise image generating unit updates the variable s to s+1 at STEP ST914, and the procedure returns to STEP ST906. If it is determined in STEP ST909 that the variable s is equal to m, the procedure proceeds to STEP S910.

At STEP ST910, the blue noise image generating unit determines whether or not the variable j is equal to n. If it is determined that the variable j is not equal to n, the blue noise image generating unit updates the variable j to j+1 at STEP S915, and the procedure returns to STEP ST905. If it is determined in STEP ST910 that the variable j is equal to n, the procedure proceeds to STEP ST911.

At STEP ST911, the blue noise image generating unit determines whether or not the variable i is equal to n. If it is determined that the variable i is not equal to n, the blue noise image generating unit updates the variable i to "i+1" at STEP ST916, and the procedure returns to STEP ST903. If it is determined in STEP ST911 that the variable i is equal to n, the blue noise image generating unit outputs the blue noise image of n×n pixels at STEP ST912, and thus the procedure is terminated.

In the following, processing performed by the RR' random array generating unit 201 in the present embodiment will be described.

The RR' random array generating unit 201 performs binarization processing on the blue noise image generated by the blue noise image generating unit, using an error diffusion technique. Then, the RR' random array generating unit 201 associates each of the binary values obtained by the binarization processing with either R or R', so as to generate the RR' random array pattern S21 as illustrated in FIG. 3.

In this embodiment, for the error diffusion technique, the Floyd-Steinberg error diffusion technique is used. However, another error diffusion technique can be used.

In addition, the error diffusion technique is used in this embodiment since it allows low frequency signal components to be retained in quantization processing. However, another quantization technique can be used if it brings about a similar effect.

Figure 15:
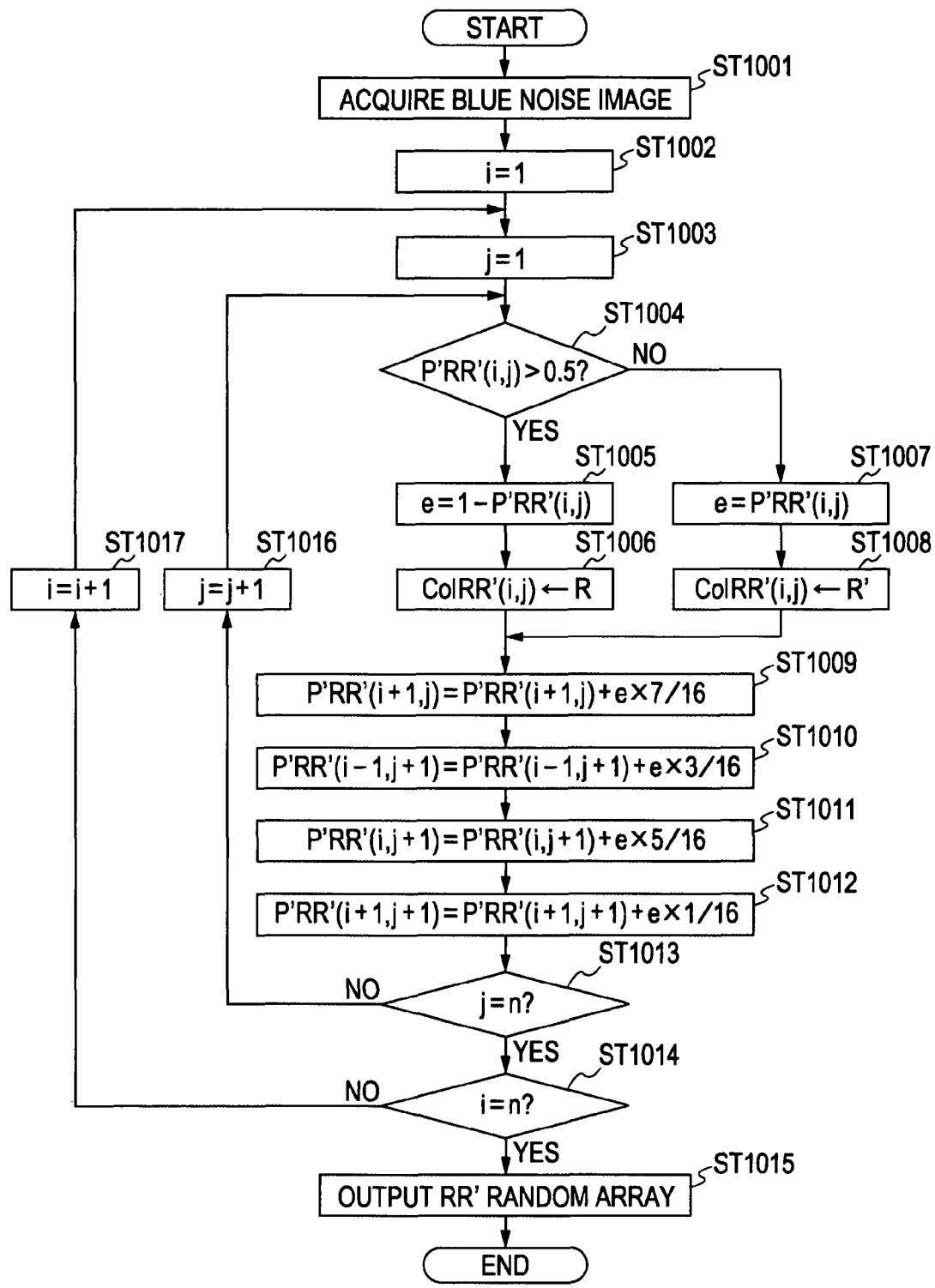
FIG. 15 is a flowchart illustrating a processing procedure performed by an RR' random array generating unit according to an embodiment of the present invention.

FIG. 15 is a flowchart illustrating a processing procedure performed by the RR' random array generating unit 201 in the present embodiment.

At STEP ST1001, the RR' random array generating unit 201 acquires the blue noise image of n×n pixels generated by the blue noise image generating unit.

At STEP ST1002, the RR' random array generating unit 201 initializes a variable i representing a position of each pixel to be processed to 1. At STEP ST1003, the RR' random array generating unit 201 initializes a variable j representing a position of each pixel to be processed to 1.

At STEP ST1004, the RR' random array generating unit 201 determines whether or not P'RR'(i, j) is greater than 0.5. If it is determined that P'RR'(i, j) is greater than 0.5, the RR' random array generating unit 201 sets e to 1−P'RR'(i, j) at STEP ST1005 and sets ColRR'(i, j) to R at STEP ST1006, and the procedure proceeds to STEP ST1009.

If it is determined in STEP ST1004 that P'RR'(i, j) is equal to or less than 0.5, the RR' random array generating unit 201 sets e to P'RR'(i, j) at STEP ST1007 and sets ColRR'(i, j) to R' at STEP ST1008, and the procedure proceeds to STEP ST1009.

At STEP ST1009, the RR' random array generating unit 201 updates P'RR'(i+1, j) to P'RR'(i+1, j)+e×7/16 at STEP ST1009 and updates P'RR'(i−1, j+1) to P'RR'(i−1, j+1)+e×3/16 at STEP ST1010. The RR' random array generating unit 201 updates P'RR'(i, j+1) to P'RR'(i, j+1)+e×5/16 at STEP ST1011 and updates P'RR' (i+1, j+1) to P'RR'(i+1, j+1)+e×1/16 at STEP ST1012, and then the procedure proceeds to STEP ST1013.

At STEP ST1013, the RR' random array generating unit 201 determines whether or not the variable j is equal to n. If it is determined that the variable j is not equal to n, the RR' random array generating unit 201 updates the variable j to j+1 at STEP ST1016, and the procedure returns to STEP ST1004. If it is determined in STEP ST1013 that the variable j is equal to n, the procedure proceeds to STEP ST1014.

At STEP ST1014, the RR' random array generating unit 201 determines whether or not the variable i is equal to n. If it is determined that the variable i is not equal to n, the RR' random array generating unit 201 updates the variable i to i+1 at STEP ST1017, and the procedure returns to STEP ST1003. If it is determined in STEP ST1014 that the variable i is equal to n, the RR' random array generating unit 201 outputs the RR' random array of n×n pixels at STEP ST1015, and thus the procedure is terminated.

Third Embodiment

Figures 16, 17:
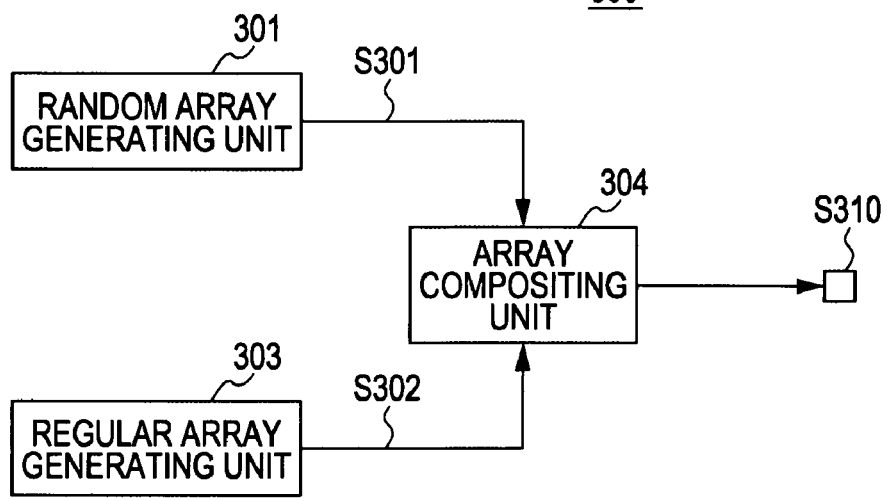
FIG. 16 illustrates a filter pattern to be generated by an image processing apparatus according to an embodiment of the present invention.
FIG. 17 is a block diagram illustrating a configuration of an image processing apparatus according to an embodiment of the present invention.

In this embodiment, a color filter pattern S310 illustrated in FIG. 16 is generated using an image processing apparatus 300 illustrated in FIG. 17.

As illustrated in FIG. 17, the image processing apparatus 300 includes, for example, a random array generating unit 301, a regular array generating unit 303, and an array compositing unit 304.

In the image processing apparatus 300, the random array generating unit 301 generates an RB random array pattern S301 in which R filters and B filters are arranged. The regular array generating unit 303 generates a G regular array pattern S302 in which only G filters are arranged.

The array compositing unit 304 rearranges the RB random array pattern S301 generated by the random array generating unit 301 in a checkered pattern and also rearranges the G regular array pattern S302 generated by the regular array generating unit 303 in a checkered pattern. Then, the array compositing unit 304 composites these two patterns so as to generate the color filter pattern S310 illustrated in FIG. 16.

In this embodiment, the case is described in which one random array generating unit 301 and one regular array generating unit 303 are used. However, a plurality of the random array generating units 301 and the regular array generating units can be used.

It should be understood by those skilled in the art that various modifications, combinations, sub-combinations and alterations may occur depending on design requirements and other factors insofar as they are within the scope of the appended claims or the equivalents thereof.

What is claimed is:

1. A method for manufacturing a color image pickup device including a pixel group in which a plurality of pixels each having a photoelectric conversion element and a color filter are arranged, the method comprising the steps of:

generating a random array pattern in which color filters of at least one color component are randomly arranged for an arbitrary pixel position, so that the occurrence frequency of color filters of a color component in a region having a predetermined size including the arbitrary pixel position is within a desired error range;

generating a regular array pattern in which color filters of at least one color component are regularly arranged, the color component being different from the color component of the filters randomly arranged in the random array generating step; and generating a color filter pattern by compositing in a regular manner the random array pattern generated in the random array generating step and the regular array pattern generated in the regular array generating step, wherein the random array generating step:

randomly selects a target pixel position from pixel positions in a color filter pattern regularly arranged, replaces a color component allocated at the target pixel position with another color component, and when the occurrence frequency of color filters of a color component in a region of a predetermined size including the target pixel position is not within a desired error range, changes the other color component allocated at the target pixel position back to the original color component.

2. A method for manufacturing a color image pickup device including a pixel group in which a plurality of pixels each having a photoelectric conversion element and a color filter are arranged, the method comprising the steps of:

generating a random array pattern in which color filters of at least one color component are randomly arranged for an arbitrary pixel position, so that the occurrence frequency of color filters of a color component in a region having a predetermined size including the arbitrary pixel position is within a desired error range;

generating a regular array pattern in which color filters of at least one color component are regularly arranged, the color component being different from the color component of the filters randomly arranged in the random array generating step; and generating a color filter pattern by compositing in a regular manner the random array pattern generated in the random array generating step and the regular array pattern generated in the regular array generating step, wherein the random array generating step performs processing in which pixel values in an image obtained by high-pass filtering a white noise image having pixel values are quantized, so that each of the quantized pixel values is associated with one color component, the pixel values of the white noise image being continuous values or discrete values represented by predetermined quantization bit numbers.

3. A method for manufacturing a color image pickup device including a pixel group in which a plurality of pixels each having a photoelectric conversion element and a color filter are arranged, the method comprising the steps of:

generating a random array pattern in which color filters of at least one color component are randomly arranged for an arbitrary pixel position, so that the occurrence frequency of color filters of a color component in a region having a predetermined size including the arbitrary pixel position is within a desired error range;

generating a regular array pattern in which color filters of at least one color component are regularly arranged, the color component being different from the color component of the filters randomly arranged in the random array generating step; and generating a color filter pattern by compositing in a regular manner the random array pattern generated in the random array generating step and the regular array pattern generated in the regular array generating step, wherein:

when six color components including a first red color component, a first blue color component, a first green color component, a second red color component, a second blue color component, and a second green color component are set, among the three second color components, the second red color component being closest to the first red color component, the second blue color component being closest to the first blue color component, the second green color component being closest to the first green color component, the random array generating step generates a first random array pattern in which color filters of the first red color component and the second red color component are randomly arranged and a second random array pattern in which color filters of the first blue color component and the second blue color component are randomly arranged, the regular array generating step generates a regular array pattern in which color filters of the first green color component and the second green color component are regularly arranged, and the color filter generating step generates the color filter pattern by compositing in a regular manner the first random array pattern, the second random array pattern, and the regular array pattern.

4. A method for manufacturing a color image pickup device including a pixel group in which a plurality of pixels each having a photoelectric conversion element and a color filter are arranged, the method comprising the steps of:

generating a random array pattern in which color filters of at least one color component are randomly arranged for an arbitrary pixel position, so that the occurrence frequency of color filters of a color component in a region having a predetermined size including the arbitrary pixel position is within a desired error range;

generating a regular array pattern in which color filters of at least one color component are regularly arranged, the color component being different from the color component of the filters randomly arranged in the random array generating step; and generating a color filter pattern by compositing in a regular manner the random array pattern generated in the random array generating step and the regular array pattern generated in the regular array generating step, wherein:

when six color components including a first red color component, a first blue color component, a first green color component, a second red color component, a second blue color component, and a second green color component are set, among the three second color components, the second red color component being closest to the first red color component, the second blue color component being closest to the first blue color component, the second green color component being closest to the first green color component, the random array generating step generates a random array pattern in which color filters of the first red color component, the second red color component, the first blue color component, and the second blue color component are randomly arranged, the regular array generating step generates a regular array pattern in which color filters of the first green color component and the second green color component are regularly arranged, and the color filter generating step generates the color filter pattern by compositing the random array pattern and the regular array pattern in a regular manner.

5. An apparatus for manufacturing a color image pickup device including a pixel group in which a plurality of pixels each having a photoelectric conversion element and a color filter are arranged, the apparatus comprising:

random array generating means configured to generate a random array pattern in which color filters of at least one color component are randomly arranged for an arbitrary pixel position, so that the occurrence frequency of color filters of a color component in a region having a predetermined size including the arbitrary pixel position is within a desired error range;

regular array generating means configured to generate a regular array pattern in which color filters of at least one color component are regularly arranged, the color component being different from the color component of the filters randomly arranged by the random array generating means; and color filter generating means configured to generate a color filter pattern by compositing in a regular manner the random array pattern generated by the random array generating means and the regular array pattern generated by the regular array generating means, wherein the random array generating means:
  randomly selects a target pixel position from pixel positions in a color filter pattern regularly arranged,
  replaces a color component allocated at the target pixel position with another color component, and
  when the occurrence frequency of color filters of a color component in a region having a predetermined size including the target pixel position is not within a desired error range, changes the other color component allocated at the target pixel position back to the original color component.

6. An apparatus for manufacturing a color image pickup device including a pixel group in which a plurality of pixels each having a photoelectric conversion element and a color filter are arranged, the apparatus comprising:

random array generating means configured to generate a random array pattern in which color filters of at least one color component are randomly arranged for an arbitrary pixel position, so that the occurrence frequency of color filters of a color component in a region having a predetermined size including the arbitrary pixel position is within a desired error range;

regular array generating means configured to generate a regular array pattern in which color filters of at least one color component are regularly arranged, the color component being different from the color component of the filters randomly arranged by the random array generating means; and color filter generating means configured to generate a color filter pattern by compositing in a regular manner the random array pattern generated by the random array generating means and the regular array pattern generated by the regular array generating means, wherein the random array generating means performs processing in which pixel values in an image obtained by high-pass filtering a white noise image having pixel values are quantized, so that each of the quantized pixel values is associated with one color component, the pixel values of the white noise image being continuous values or discrete values represented by predetermined quantization bit numbers.

* * * * *